(12) United States Patent
Miyamoto et al.

(10) Patent No.: US 11,417,388 B2
(45) Date of Patent: Aug. 16, 2022

(54) PROCESSING OF UNASSIGNED ROW ADDRESS IN A MEMORY

(71) Applicant: Micron Technology, Inc., Boise, ID (US)

(72) Inventors: Takayuki Miyamoto, Machida (JP); Satoshi Yamanaka, Tachikawa (JP)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 16/904,004

(22) Filed: Jun. 17, 2020

(65) Prior Publication Data

US 2021/0398585 A1   Dec. 23, 2021

(51) Int. Cl.
| G11C 11/408 | (2006.01) |
| G11C 11/4096 | (2006.01) |
| G11C 11/4094 | (2006.01) |
| G11C 11/4093 | (2006.01) |

(52) U.S. Cl.
CPC ...... G11C 11/4087 (2013.01); G11C 11/4085 (2013.01); G11C 11/4093 (2013.01); G11C 11/4094 (2013.01); G11C 11/4096 (2013.01)

(58) Field of Classification Search
CPC .................................................. G11C 11/4085
USPC .................................................... 365/230.06
See application file for complete search history.

(56) References Cited

U.S. PATENT DOCUMENTS

2020/0082889 A1*  3/2020  Yu .......................... G11C 5/147
2020/0111523 A1*  4/2020  Lee ..................... H01L 25/0652

* cited by examiner

*Primary Examiner* — Anthan Tran
(74) *Attorney, Agent, or Firm* — Dorsey & Whitney LLP

(57) ABSTRACT

Semiconductor devices that include circuitry to mitigate unstable or metastable states in logic circuits in response to receipt of an unassigned row address. The semiconductor device may include one or more logic circuits that are configured to adjust particular address-based control signals to mitigate processing based on the unassigned row address. For example, the one or more logic circuits may override processing of the unassigned row address to provide control signals that correspond to an assigned row address, which may allow the semiconductor device to operate in a known state, rather than performing operations based on an unassigned row address.

10 Claims, 8 Drawing Sheets

PROCESSING OF UNASSIGNED ROW ADDRESS IN A MEMORY

BACKGROUND

High data reliability, high speed of memory access, low power, and reduced chip size are features that are demanded from semiconductor memory. As memory density increases, a number of address bits may be increased to accommodate the additional addressable memory cells. However, in some memory system, command and address bus widths may remain unchanged, so a read address may be provided serially over a command and address bus in multiple subparts. The semiconductor device may perform memory access operations based on the read address. Some particular read address bit combinations may be unassigned or illegal (e.g., no memory cell or cells assigned to the read address). When the semiconductor device performs memory access operations using an illegal read address, some downstream circuitry may enter an unknown or metastable state. When circuitry of the semiconductor device enters a metastable state, data provided from the semiconductor device may be unreliable or unpredictable, which may cause disruptions in the memory system.

DETAILED DESCRIPTION

Figure 1:
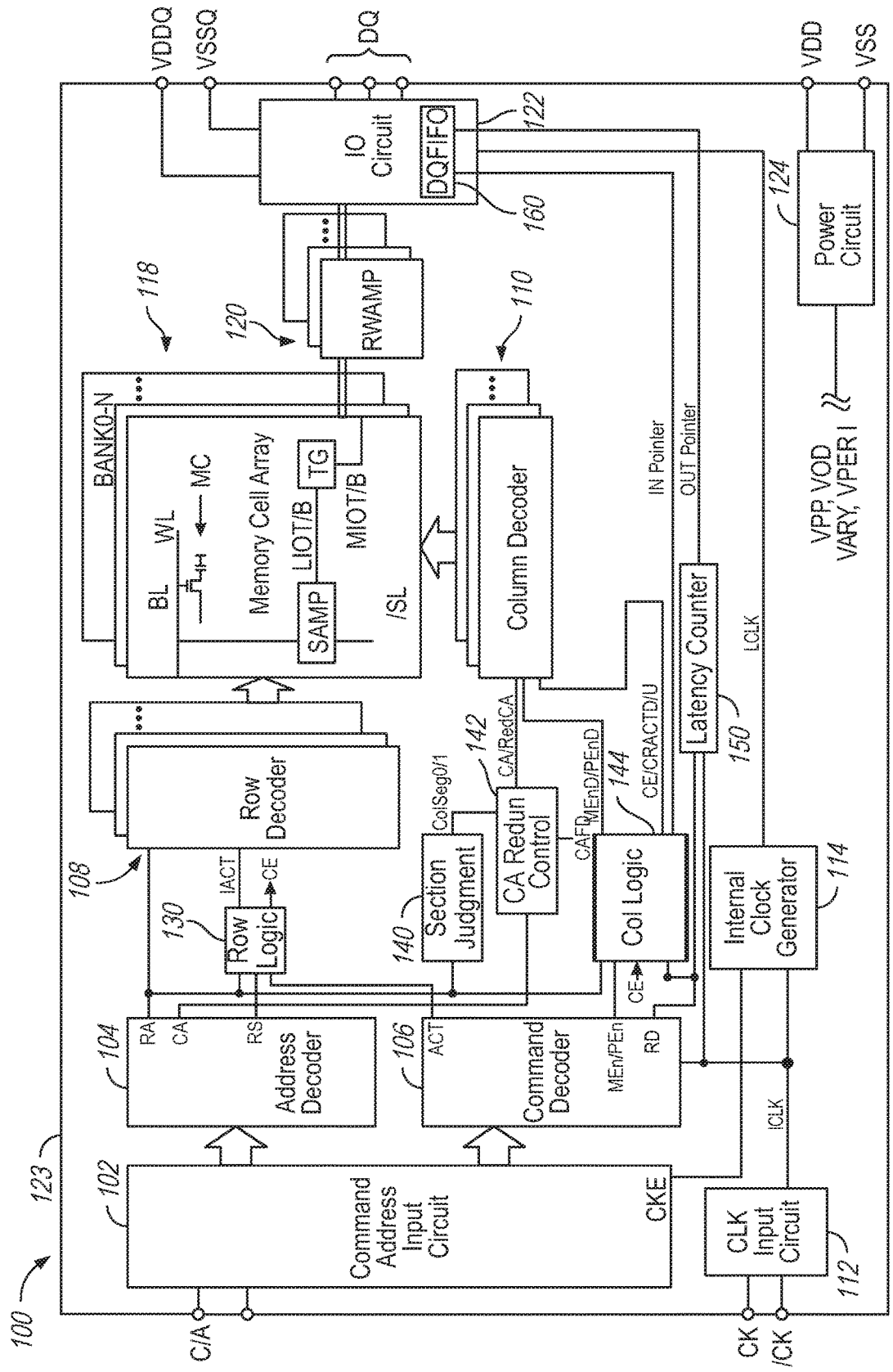
FIG. 1 illustrates a schematic block diagram of a semiconductor device in accordance with an embodiment of the present disclosure.

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

This disclosure describes semiconductor devices that include circuitry to mitigate unstable or metastable states in logic circuits in response to receipt of an unassigned row address. An unassigned row address is a combination of address bit values that are not assigned to a particular row of memory cells of the memory array. The row address may be combined with a bank address and a column address to target a particular group of memory cells of a memory cell array. The row address (and the bank address) may be received with an activate command ACT, and a column address may be received via a read or write command. In some memory systems, the ACT command may be a four-cycle command (e.g., received over 4 clock cycles) or may be considered two contiguous two-cycle commands (e.g., ACT-1 received over a first 2 clock cycles followed by ACT-2 received over 2 subsequent clock cycles. In some applications, part of the row address may be received with the ACT-1 command and part of the row address may be received with the ACT-2 command. Thus, the full row address may not be available until the ACT-2 command is received.

Typically, when an ACT command and a row address are received, the row address may be decoded to provide a decoded row address to downstream circuitry along with an internal ACT command. When an unassigned row address is received, the internal ACT command may be blocked to prevent downstream circuitry from performing operations based on the unassigned row address. However, in some examples, detection of an unassigned row address may be dependent relative values of a bit (e.g., RA16) received with the ACT-1 command and a bit (e.g., RA17) received with the ACT-2 command. In such cases, the internal ACT command may be provided prior to detecting that the row address is unassigned. Consequently, the semiconductor device may be unable to prevent some operations from being performed based on the unassigned row address. Performance of operations by downstream circuitry based on an unassigned row address may cause the downstream circuitry to enter unknown or metastable states, in some examples. When circuitry of the semiconductor device enters the metastable state, operation of the semiconductor device may be unreliable or unpredictable, which may cause disruptions to operation of the semiconductor device or an installed memory system.

Thus, the semiconductor device may include one or more logic circuits that are configured to adjust particular address-based control signals to mitigate processing based on the unassigned row address. For example, the one or more logic circuits may override processing of the unassigned row address to provide control signals that correspond to an assigned row address, which may allow the semiconductor device to operate in a known state (e.g., as compared with performing operations based on an unassigned row address). That is, the adjustment to the address-based control signals may not necessarily be intended to "correct" the unassigned row address to a particular target or assigned address. Rather, the intent may be to prevent circuitry of the semiconductor device from attempting to determine whether a column address is redundant and/or to provide an unknown column address that targets activation of an undefined column in the memory cell array, as an example. Such operations may result in the semiconductor device entering an unknown or metastable state. An unassigned row address may, in some examples, be detected based on relative values of two bits of the row address. In some examples, the two bits may include one bit received with the ACT-1 command and one bit received with the ACT-2 command. The one or more logic circuits may perform a bitwise between the two bits of the row address to provide an unassigned row address signal. In some examples, the two bits include the row address bits RA16 and RA17.

In some examples, the one or more logic circuits may be included in address logic circuitry configured to identify target columns and target column sections or segments, such as a section judgment circuit and/or a column logic circuits. The one or more logic circuits may cause the address logic circuitry to override column-based control signals in response to detection of an unassigned row address. The column-based control signals may be provided to column decoder circuitry. For example, typically, the section judgment circuit may be configured to determine a target column segment of the memory cell array based on particular bits of the row address (e.g., via one or more decoder circuits) and to provide a column segment address that indicates the target column segment of the memory array.

However, some bit combinations of the particular bits of the row address may be undefined or unassigned in the decoder logic of the section judgment circuit. Thus, when the section judgment circuit attempts to determine the column segment address based on an undefined bit combination, the output of the section judgment may be unpredictable or metastable. Thus, the section judgment circuit may further include the one or more logic circuits that are configured to determine whether the row address is an unassigned row address, and in response to determining that the row address is an unassigned row address, to cause one or more of the decoder circuits to override a corresponding bit of the column segment address with a particular value that corresponds to a valid or assigned column segment address. The one or more logic circuits may each perform a logical bitwise (e.g., AND logic) comparison between two bits of the row address to detect whether the row address is unassigned. In some examples, the two bits include the row address bits RA16 and RA17. As previously described, the two bits may be received at the semiconductor device at different times, such as the first bit received with the ACT-1 command and the second bit received with the ACT-2 command. As such, the one or more logic circuits may prevent the semiconductor device from entering a metastable state by trying to activate an undefined column.

As a further precaution against operations from being performed based on an unassigned row address, the semiconductor device may include logic circuits to disable column select operations on the memory cell array. For example, a memory array may be divided into parts or sides, and the parts or sides may be independently enabled via respective array side enable signals. A command decoder (e.g., via a mode register) may provide the array side enable signals to indicate whether one (e.g., X8 configuration) or both (e.g., X16 configuration) sides of the memory cell array are enabled. A column logic circuit may be configured to enable a column select operation to facilitate activation of a column on one or both sides of the memory cell array based on the array side enable signals during a memory access operation. However, to mitigate unpredictable behavior when an unassigned row address is received, the column logic circuitry may further include a logic circuit that overrides the array side enable signals to disable both sides of the memory array to prevent activation of any columns within the memory cell army in response to detection of the illegal row address. The logic circuit may perform a logical bitwise (e.g., AND logic) comparison between two bits of the row address to detect whether the row address is unassigned. In some examples, the two bits include the row address bits RA16 and RA17. As previously described, the two bits may be received at the semiconductor device at different times, such as the first bit received with the ACT-1 command and the second bit received with the ACT-2 command. As such, the one or more logic circuits may prevent the semiconductor device from entering a metastable state by trying to activate an undefined column.

In addition, a read operation is performed, data terminal (DQ) first in, first out (FIFO) buffers may be used to temporarily store read data prior to being transmitted to a data bus via a data terminal DQ. Operation of the DQ FIFO buffer may be controlled by input and output pointers to indicate current input and output storage locations, respectively. The DQ FIFO buffer may be a synchronous buffer that is configured to update the input and output pointers at the same time. Thus, during a normal read operation, both of the input and output pointers are contemporaneously adjusted (e.g., incremented or decremented) to remain synchronized for a next access operation as data is written into and read from. The input pointer may be adjusted based on a column enable signal. The column enable signal may be set in response to the internal ACT signal and a row select signal.

However, when a row address is unassigned, the row select signal may remain cleared; preventing the column enable signal from being set, which may prevent the input pointer from being adjusted. The output pointer may be adjusted in response to a read command from a command decoder. Thus, the output pointer may be adjusted independent of a determination as to whether the row address is unassigned. When the output pointer is adjusted and the input pointer is not, the relationship between the input and output pointers may be out of synch, which may result in an inability to identify proper locations of data stored in the DQ FIFO buffer. Thus, the semiconductor device may further include a logic circuit that is configured to cause the input pointer to adjust when an unassigned read address is detected by overriding the row select signal. The logic circuit may perform a logical bitwise (e.g., AND logic) comparison between two bits of the row address to detect whether the row address is unassigned. In some examples, the two bits include the row address bits RA16 and RA17. As previously described, the two bits may be received at the semiconductor device at different times, such as the first bit received with the ACT-1 command and the second bit received with the ACT-2 command.

FIG. 1 illustrates a schematic block diagram of a semiconductor device 100 in accordance with an embodiment of the present disclosure. The semiconductor device 100 includes a memory die. The memory die may include a command/address input circuit 102, an address decoder 104, a command decoder 106, a clock input circuit 112, internal clock generator 114, a row logic circuit 130, a section judgment circuit 140, a column address redundancy control circuit 142, a column logic circuit 144, row decoder 108, column decoder 110, a latency counter 150, a memory cell array 118, read/write amplifiers 120, an IO circuit 122, DQ FIFO buffers 160, and power circuit 190.

In some embodiments, the semiconductor device 100 may include, without limitation, a dynamic random-access memory (DRAM) device, such as double data rate (DDR) DDR4, DDR5, low power (LP) DDR, integrated into a single semiconductor chip, for example. The die may be mounted on an external substrate, for example, a memory module substrate, a mother board or the like. The semiconductor device 100 may further include a memory cell array 118. The memory cell array 118 includes a plurality of banks, each bank including a plurality of word lines WL, a plurality of bit lines BL (e.g., digit lines, access lines, data I/O lines, etc.), and a plurality of memory cells MC arranged at intersections of the plurality of word lines WL and the plurality of bit lines BL. The selection of the word line WL is performed by a row decoder 108 and the selection of the bit line BL (along with a column select signal CS) is performed by a column decoder 110. Sense amplifiers SAMP are located near their corresponding bit lines BL and connected to at least one respective local I/O line based on the CS signal, which is in turn coupled to a respective one of at least two main I/O line pairs, via transfer gates TG, which function as switches.

In some embodiments, the memory cell array 118 may include memory array mats having respective digit lines and memory cells. The memory array mats may be separated by areas for control circuitry, including the sense amplifiers SAMP connected to a respective subset (e.g., even or odd) bitlines of adjacent memory array mats to perform sense operations on corresponding memory cells.

The semiconductor device 100 may employ a plurality of external terminals that include address and command terminals coupled to command/address bus (C/A), clock terminals CK and /CK, data terminals DQ, DQS, and DM, power supply terminals VDD, VSS.

The command/address terminals may be supplied with an address signal and a bank address signal from outside via command/address bus 110. The address signal and the bank address signal supplied to the address terminals are transferred, via the command/address input circuit 102, to an address decoder 104. The address decoder 104 receives the address signal and decodes the address signal to provide decoded address signal ADD. The ADD signal includes a decoded row address RA signal and a decoded column address CA signal. The decoded RA signal is provided to the row decoder 108, and a decoded CA signal is provided to the column decoder 110 via the column address redundant control circuit 142. The address decoder 104 may be configured to determine whether the row address is assigned, and may enable a row select signal RS in response to a determination that the row address is assigned. Otherwise, the address decoder 104 may disable the RS signal. The address decoder 104 also receives the bank address signal and provides the bank address signal to the row decoder 108 and/or the column decoder 110.

The command/address terminals may further be supplied with a command signal from outside, such as, for example, a memory controller. The command signal may be provided, via the C/A bus, to the command decoder 106 via the command/address input circuit 102. The command decoder 106 decodes the command signal to generate various internal commands/signals that include an ACT command signal (e.g., with the row address), a read command signal RD or a write command signal (e.g., with the column address) to select a column and/or a wordline and a column command signal Read/Write, such as a read command or a write command, to select a bit line, etc. The row logic circuit 130 may receive the ACT command from the column decoder 106 and the decoded RA signal and the RS signal from the address decoder 104, and may provide a column enable signal CE and an ACT state signal IACT in response to the decoded RA signal and the RS signal.

The second judgment circuit 140 may determine a column segment address (e.g., column segment 0/1 signals from the second judgment circuit 140), and the column address redundant control circuit 142 may determine whether the decoded CA signal has been replaced with a redundant CA RedCA based on the column segment 0/1 signals, the read command RD, a CA fuse data CAFD signal. The column logic 144 may be configured to receive memory array P and M side enable signals PEnD and MEnD (e.g., indicating whether one (e.g., X8 configuration) or both (e.g., X16 configuration)) sides of the memory cell array 118 are enabled, the RD command, the CE signal, and the decoded RA signal. The PEn and MEn signals may be provided from a mode register (not shown) of the command decoder 106. The column logic 144 may be configured to provide the PEnD and MEnD to the column decoder 110 based on the RA signal and the PEn and MEn signals, respectively. The column logic 144 may be further configured to provide the column select enable signal CYE, and the column read activation up and down signals CRACTU/D to the column decoder 110 based on the RD signal and the CE signal.

Thus, when a read command is issued and the RA and CA are timely supplied with the read command, read data is read from a memory cell in the memory cell array 118 designated by these row address and column address. The read data DQ is output to outside from the data terminals DQ (data), DQS (data strobe), and DM (data mask) via read/write amplifiers 120 and an IO circuit 122. Similarly, when the write command is issued and a row address and a column address are timely supplied with this command, and then write data is supplied to the data terminals DQ, DQS, DM, the write data is received by data receivers in the IO circuit 122, and supplied via the IO circuit 122 and the read/write amplifiers 120 to the memory cell array 118 and written in the memory cell designated by the row address and the column address.

In some examples, a memory access operation (e.g., read, write, refresh, etc.) may be initiated in response to receipt of an activate command ACT along with the row address (e.g., and a bank address) via the C/A bus at the semiconductor device 100. The semiconductor device 100 may subsequently receive a column address with the corresponding read RD, write, etc., command. In some examples, the full ACT command may be received over multiple clock cycles (e.g., via a combination of two, two-cycle ACT-1 and ACT-2 commands), with parts of the RA received across the multiple clock cycles. For example, a first part of the row address may be received with the ACT-1 command and a second part of the row address may be received with the ACT-2 command. The RA may be combined with the bank address (not shown) and the CA to target a particular group of memory cells of a memory cell array 118. In some examples, it is possible for the RA to be set to an unassigned row address. An unassigned row address is a combination of address bit values that are not assigned to a particular row of memory cells of the memory cell array 118.

Typically, when the ACT command and the RA are received, the address decoder 104 may decode and provide the RA to downstream circuitry and the command decoder 106 may provide an internal ACT command. When an unassigned row address is received, the internal ACT command may be blocked to prevent downstream circuitry (e.g., the row logic circuit 130, the second judgment circuit 140, the column address redundant control circuit 142, the column logic 144, etc.) from performing operations based on the unassigned row address. However, in some examples, detection of an unassigned row address may be dependent relative values of a bit (e.g., RA16) received with the ACT-1 command and a bit (e.g., RA17) received with the ACT-2 command. In such cases, the internal ACT command from the command decoder may be provided prior to detecting that the row address is unassigned and being blocked. Consequently, the semiconductor device 100 may be unable to prevent some operations from being performed based on the unassigned row address. Performance of operations by downstream circuitry based on an unassigned row address may cause the downstream circuitry to enter unknown or metastable states, in some examples. When circuitry of the semiconductor device 100 enters the metastable state, operation of the semiconductor device may be unreliable or unpredictable, which may cause disruptions to operation of the semiconductor device 100 or an installed memory system.

For example, the unassigned RA may be provided to second judgment circuit 140, and the decoders of the second judgment circuit 140 may determine the column segment 0/1 signals based on an undefined combination of bit values from the unassigned RA. The undefined combination of bit values may result in the column segment 0/1 signals being set to a combination of undefined bit values, which may cause the column address redundant control circuit 142 to operate in a metastable state. To prevent the metastable state of the second judgment circuit 140 and the column address redundant control circuit 142, the second judgment circuit 140 may include one or more logic circuits that are configured to adjust the column segment 0/1 signals to indicate an assigned column segment in response to detection of an unassigned RA signal. Because the column segment 0/1 signals provided to the column address redundant control circuit 142 correspond to an assigned column segment, the column address redundant control circuit 142 may avoid entering a metastable state. The assigned column segment 0/1 signals caused by the one or more logic circuits may not be intended to "correct" the unassigned column segment 0/1 signals to a specific assigned bit combination. Rather, the adjustment to the column segment 0/1 signals caused by the one or more logic circuits may be intended to allow keep circuitry of the column address redundant control circuit 142 in a known or predictable state. The logic circuit may be configured to detect whether the RA is an unassigned row address based on relative values of two bits of the decoded RA signal. In some examples, the two bits may include one bit (e.g., RA16) received with the ACT-1 command and one bit (e.g., RA17) received with the ACT-2 command. The one or more logic circuits may perform a bitwise between the two bits of the row address.

In addition, the column logic 144 may be configured to disable column select operations on the memory cell array 118 by disabling the memory cell array 118. The memory cell array 118 may be divided into M and P sides, which may be independently enabled via the MEnD and PEnD signals. The column logic 144 may provide signals that enable a column select operation by the column decoder 110 on the one or both of the M and P sides of the memory cell array 118 based on whether the M and/or P side is enabled. In some examples, the column logic 144 may provide the MEnD and PEnD signals based on the MEn and the PEn signals, along with a logic circuit configured to override the MEn and PEn signals when set in order to disable both sides of the memory cell array 118 from performing a column select operation. The logic circuit may perform a logical bitwise (e.g., AND logic) comparison between two bits of the row address to detect whether the row address is unassigned. In some examples, the two bits include the row address bits RA16 and RA17. As previously described, the two bits may be received at the semiconductor device at different times, such as the first bit received with the ACT-1 command and the second bit received with the ACT-2 command.

In addition, a read operation is performed, DQ FIFO buffers 160 may be used to temporarily store read data prior to being transmitted to a data bus via a data terminal DQ. Operation of the DQ FIFO buffers 160 may be controlled by input IN and output OUT pointers to indicate current input and output storage locations, respectively. The DQ FIFO buffers 160 may be a synchronous buffer that is configured to update the IN and OUT pointers at the same time. Thus, during a normal read operation, both of the IN and OUT pointers are contemporaneously adjusted (e.g., incremented or decremented) to remain synchronized for a next access operation as data is written into and read from. The IN pointer may be adjusted based on the CE signal from the row logic circuit 130. The CE signal may be set in response to the ACT command and the RS signal.

However, when a row address is unassigned, the RS signal may remain cleared; preventing the CE signal from being set, which may prevent the IN pointer from being adjusted. The OUT pointer may be adjusted in response to the RD command from a command decoder, delayed according to a latency counter 150. Thus, the OUT pointer may be adjusted independent of a determination as to whether the RA is unassigned. When the OUT pointer is adjusted and the IN pointer is not, the relationship between the IN and OUT pointers may be out of synch, which may result in an inability to identify proper locations of data stored in the DQ FIFO buffers 160. Thus, the row logic circuit 130 may further include a logic circuit that is configured to cause the CE signal to be set when an unassigned RA is detected (e.g., overriding the RS signal). Because the CE signal is set, the column logic 144 may be configured to adjust the IN pointer. The logic circuit may perform a logical bitwise (e.g., AND logic) comparison between two bits of the row address to detect whether the row address is unassigned. In some examples, the two bits include the row address bits RA16 and RA17. As previously described, the two bits may be received at the semiconductor device at different times, such as the first bit received with the ACT-1 command and the second bit received with the ACT-2 command.

Turning to the explanation of the external terminals included in the semiconductor device 100, the clock terminals CK and /CK are supplied with an external clock signal and a complementary external clock signal, respectively. The external clock signals (including complementary external clock signal) may be supplied to a clock input circuit 112. The clock input circuit 112 may receive the external clock signals to generate an internal clock signal ICLK. The internal clock signal ICLK is supplied to an internal clock generator 114 and thus a phase controlled internal clock signal LCLK is generated based on the received internal clock signal ICLK. Although not limited thereto, a delay-locked loop (DLL) circuit, a duty cycle correction (DCC) circuit, or a combination thereof may be used as the internal clock generator 114. The phase controlled internal clock signal LCLK may be used as a timing signal for determining an output timing of read data.

The power supply terminals are supplied with power supply potentials VDD and VSS. These power supply potentials VDD2 and VSS are supplied to the power circuit 190. The power circuit 190 generates various internal potentials VKK, VARY, VPERI, and the like based on the power supply potentials VDD2 and VSS. The internal potential VKK is mainly used in the row decoder 108, the internal potential VARY are mainly used in the sense amplifiers included in the memory cell array 118, and the internal potential VPERI is used in many other circuit blocks.

The power supply terminals are also supplied with power supply potentials VDDQ and VSSQ. These power supply potentials VDDQ and VSSQ are supplied to the IO circuit 122. The power supply potentials VDDQ and VSSQ are typically the same potentials as the power supply potentials VDD2 and VSS, respectively. However, the dedicated power supply potentials VDDQ and VSSQ are used for the IO circuit 122 so that power supply noise generated by the IO circuit 122 does not propagate to the other circuit blocks.

Figure 2A:
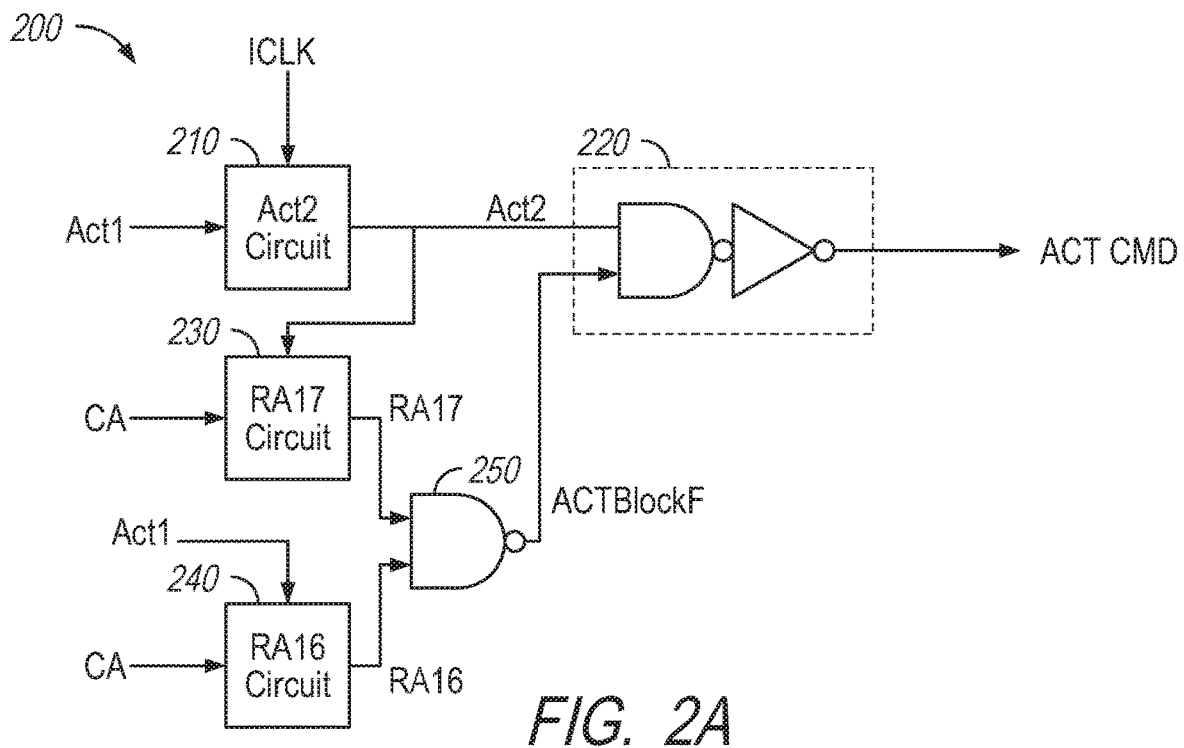
FIG. 2A depicts a block diagram of command decoder 200 in accordance with an embodiment of the disclosure.
Figure 2B:
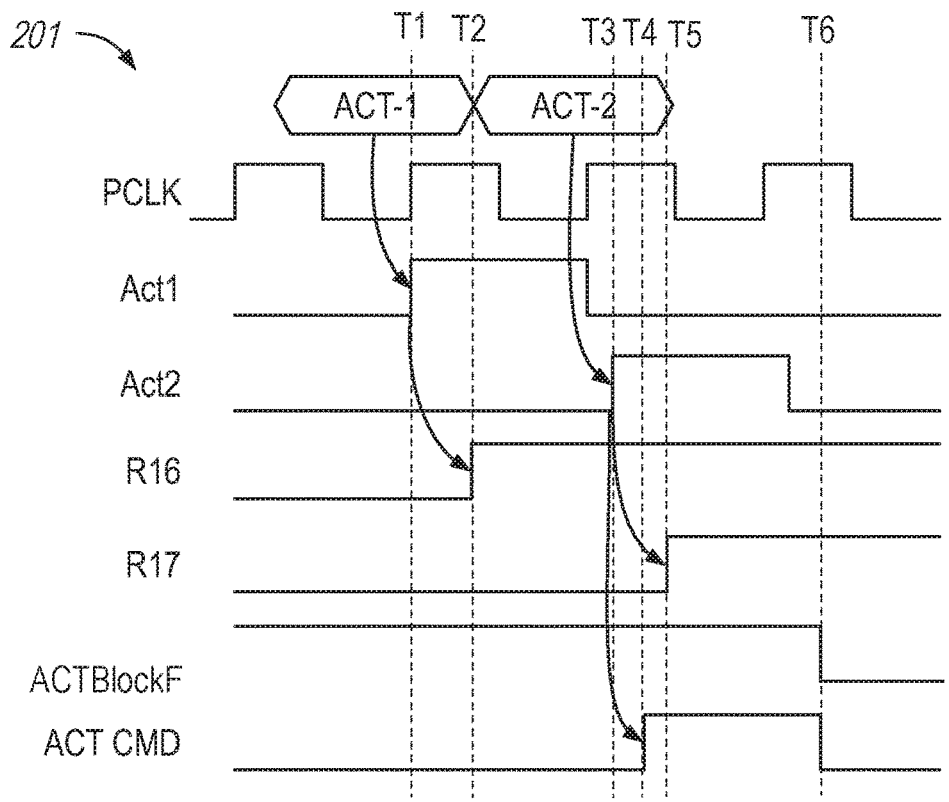
FIG. 2B depicts an exemplary timing diagram 201 demonstrating provision of an ACT CMD signal from the command decoder 200 of FIG. 2A in accordance with embodiments of the present disclosure.

FIG. 2A depicts a block diagram of command decoder 200 in accordance with an embodiment of the disclosure. FIG. 2B depicts an exemplary timing diagram 201 demonstrating provision of an ACT CMD signal from the command decoder 200 of FIG. 2A in accordance with embodiments of the present disclosure. The command decoder may include an Act2 control circuit 210, a AND gate 220, a RA17 decoder circuit 230, a RA16 decoder circuit 240, and a NAND gate 250. The command decoder 106 of FIG. 1 may implement the command decoder 200.

The Act2 control circuit 210 receive an Act1 signal based on receipt of an ACT-1 command received over a command and address bus (e.g., the CA bus of FIG. 1). In response to the Act1 command, the RA16 decoder circuit 240 may receive and provide the row address bit 16 RA16 to a NAND gate 250 from the CA bus. In response to an internal clock signal ICLK, the Act2 control circuit 210 may provide the Act2 based on a predetermined amount of time after receipt of the Act1 command. The Act2 command may correspond to receipt of an ACT-2 command received over the command address. In response to the Act2 command, the RA17 decoder circuit 230 may receive and provide the row address bit 17 RA17 to a NAND gate 250 from the CA bus. The NAND gate 250 may be configured to detect whether the received row address is an unassigned row address based on relative values of the RA16 and RA17 bits of the row address. Thus, the NAND gate 250 may perform a logical NAND bitwise comparison between the RA16 and RA17 signals to provide an active low ACT block signal. For example, when both of the RA16 and RA17 bits have a first (e.g., high or set) logical value, the ACTBlockF signal may be set to a second (e.g., low or cleared) logical value. Otherwise, the ACTBlockF may be set to the first logical value.

The AND gate 220 may provide the ACT CMD signal based on a bitwise logical AND comparison between the Act2 signal and the ACTBlockF signal. However, because the RA17 decoder circuit 230 is configured to determine the RA17 signal in response to the Act2 signal, the AND gate 220 may provide the ACT CMD at an output prior to determining whether the row address is an unassigned row address via the RA17 decoder circuit 230, the RA16 decoder circuit 240, and the NAND gate 250. Accordingly, the ACT CMD corresponding to an unassigned row address may be output from the AND gate 220 before it can be blocked by the NAND gate 250.

As previously noted, the timing diagram 201 of FIG. 2B depicts operation of the command decoder 200 in response to receipt of an unassigned row address, which may be indicated by both of the RA16 and the RA17 signals having the first logical values. With reference to FIGS. 2A and 2B, prior to time T1, the NAND gate 250 is configured to set the ACTBlockF signal to the first logical value based on the RA16 and the RA17 signals both having the second logical values. Also prior to time T1, the external ACT-1 command may be received, along with part of a row address that includes bit RA16. At time T1, the Act1 signal may transition to the first logical value in response to the ACT-1 command and the ICLK signal. At time T2, the RA16 decoder circuit 240 may transition the RA16 signal to the first logical value based on the received row address and in response to the Act1 signal.

Between times T2 and T3, the external ACT-2 command may be received, along with part of a row address that includes bit RA17. At time T3, the Act2 control circuit 210 may cause the Act2 signal to transition to the first logical value in response to the ACT-2 command and the ICLK signal. At time T4, the AND gate 220 may provide the ACT CMD based on the Act2 signal having the first logical value and the ACTBlockF signal having the high logical value. At time T5, the RA17 decoder circuit 230 may transition the RA17 signal to the first logical value based on the received row address and in response to the Act2 signal. At time T6, the NAND gate 250 may transition the ACTBlockF signal to the second logical value in response to both the RA16 and RA17 signals having the first logical values. In response to the transition of the ACTBlockF signal to the second logical value, the AND gate 220 may transition the ACT CMD signal to the second logical value. Thus, as shown in the timing diagram 201, the ACT CMD signal may be provided from the command decoder 200 prior to detection of an unassigned row address, which may cause downstream circuitry to operate in metastable states.

Applicant notes that the timing diagram 201 is exemplary, and that the relative timing between signals transitions is not intended to be to scale. Different relative timing relationships may be implemented without departing from the scope of the disclosure.

Figure 3:
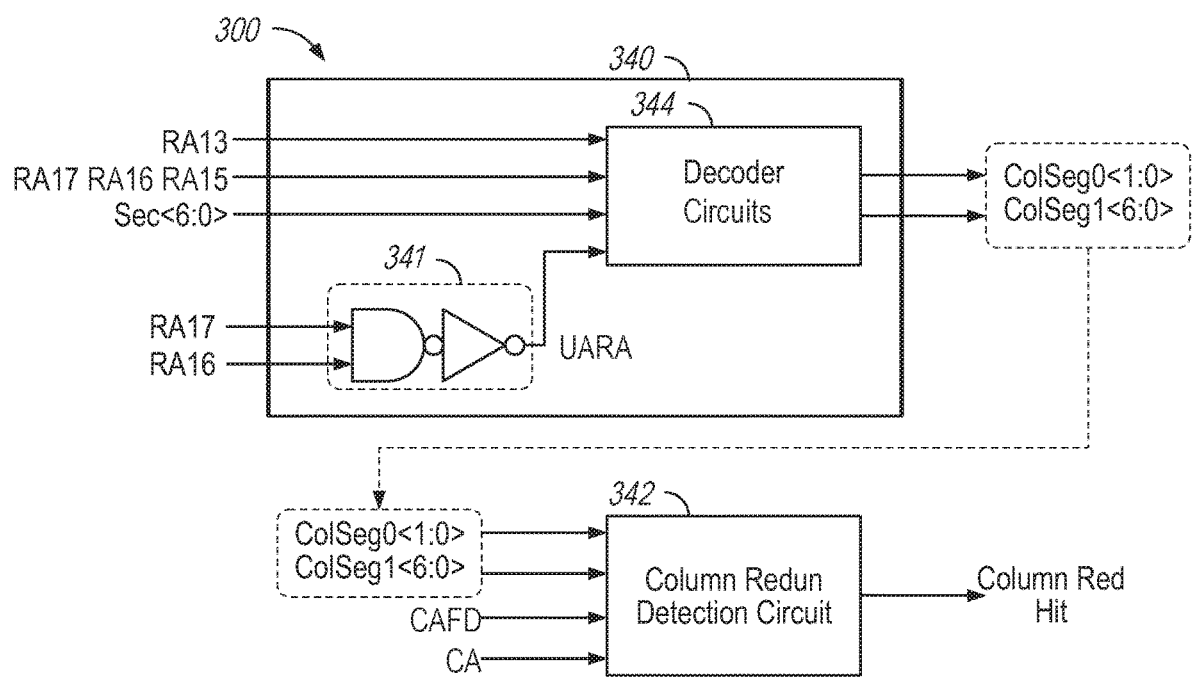
FIG. 3 depicts a block diagram of a portion of a semiconductor device 300 in accordance with an embodiment of the disclosure.

FIG. 3 illustrates a block diagram of a portion of a semiconductor device 300 in accordance with an embodiment of the disclosure. The semiconductor device 300 includes a section judgment circuit 340 coupled to a column redundancy detection circuit 342. The semiconductor device 100 of FIG. 1 may implement the semiconductor device 300.

The section judgment circuit 340 may include a logic circuit 341 coupled to a decoder circuits 344. The logic circuit 341 may be configured to perform a bitwise AND logic comparison between row address RA signals RA16 and RA17 to provide an unassigned RA signal UARA. The UARA signal may be set (e.g., first or high logical value) when both the RA16 and RA17 signals are set. Otherwise, the UARA signal may be cleared (e.g., second or low logical value).

The decoder circuits 344 may be configured to receive the UARA signal, RA signals RA13 RA15, RA16, and RA17, and section bits SEC<6:0>. The SEC<6:0> bits may be based on RA signals RA12-RA0. The decoder circuits 344 may be configured to provide column segment 0 and 1 signals ColSeg0<1:0> and ColSeg1<6:0> based on the received signals. In some examples, the decoder circuits 344 may include a respective decoder circuit for each of the ColSeg0<1:0> and ColSeg1<6:0> signals (e.g., 9 decoder circuits).

The column redundancy detection circuit 342 may be configured to receive the ColSeg0<1:0> and ColSeg1<6:0> signals, column address fuse data CAFD, and a column address CA. The column redundancy detection circuit 342 may be configured to determine whether the CA has been replaced by a redundant CA based on the ColSeg0<1:0> and ColSeg1<6:0> signals and the CAFD. In response to a determination that the CA has been replaced by a redundant CA, the column redundancy detection circuit 342 may set the column redundant hit signal. Otherwise, the column redundant hit signal may be cleared. The redundant CA (e.g., RedCA of FIG. 1) may be selected in response to the column redundant hit signal being set.

In operation, during a memory access operation, a sequence of operations within the semiconductor device 300 occur, with latter operations sometimes dependent on information from prior operations in the sequence. In some examples, parts of the RA may be received across the multiple clock cycles with an ACT command. For example, RA13, RA15, and RA16 may be received before RA17, in some examples. In some examples, when both RA17 and RA16 are set, the entire RA may be an unassigned RA. Thus, in response to the RA17 and RA16 being set, the logic circuit 341 may set the UARA to indicate an unassigned RA.

Figure 4:
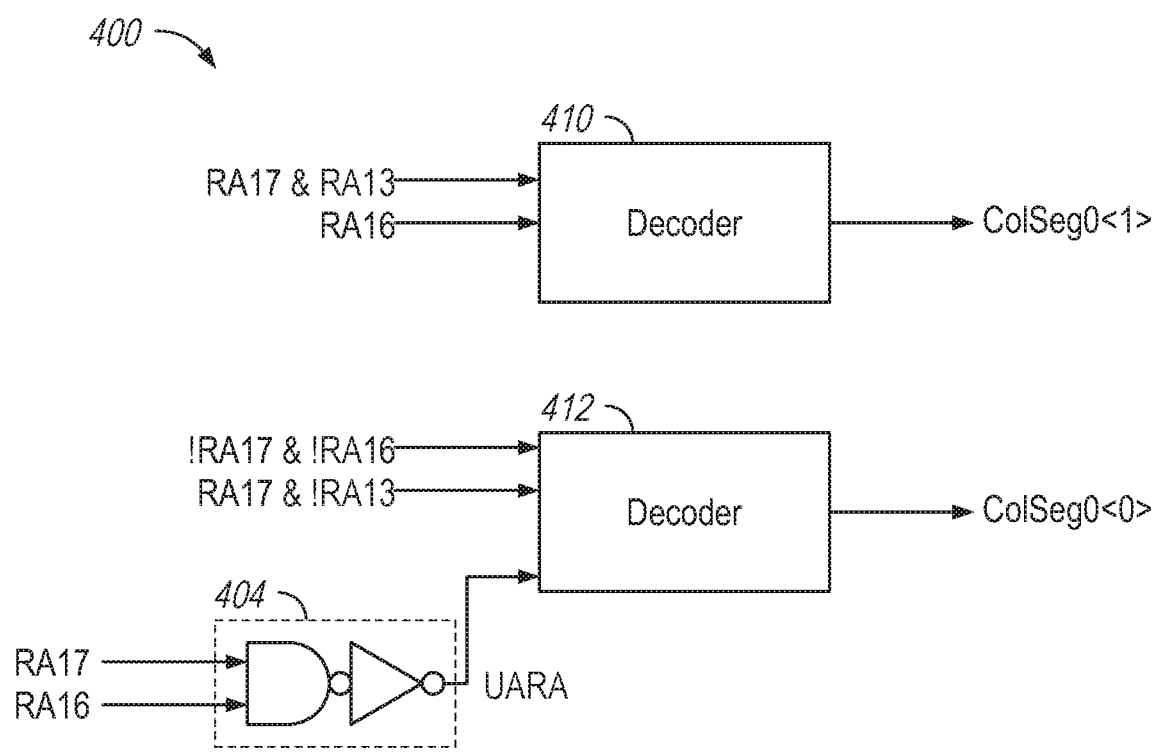
FIG. 4 depicts a block diagram of column segment 0 decoders 300 in accordance with embodiments of the present disclosure.

Without the UARA signal, the unassigned RA could cause the decoder circuits 344 to clear all of the ColSeg0<1:0> and the ColSeg1<6:0> signals, which would correspond to an unassigned column segment address. An unassigned column segment address may cause the decoder circuits 344 to enter a metastable state, which may cause the column redundancy detection circuit 342 to provide an unpredictable result. Thus, the UARA signal may be provided to at least one decoder of the column redundancy detection circuit 342 for the ColSeg0<1:0> signals and to at least one decoder for the ColSeg1<6:0> signals. In response to the UARA signal indicating an unassigned RA, the at least one decoder of the decoder circuits 344 for the ColSeg0<1:0> signals may force the corresponding one of the ColSeg0<1:0> signals to be set. For example, FIG. 4 depicts a block diagram of column segment 0 decoders 400 in accordance with embodiments of the present disclosure. As shown in FIG. 4, a decoder 410 is configured to set the ColSeg0<1> signal in response to RA17 and RA13 being set OR in response to RA16 being set. A decoder 412 is configured to set the ColSeg0<0> signal in response to both RA17 and RA16 being cleared OR in response to RA17 being set and RA13 being cleared. In addition, the decoder 412 is configured to set the ColSeg0<0> signal in response to the UARA signal being set (e.g., detection of an unassigned RA). The UARA signal may be set based on a bitwise AND comparison (e.g., via an AND gate logic circuit 404) between the RA17 and RA16 signals. Applicant respectfully submits that the particular logic statements for each of the decoder 410 and the decoder 412 are exemplary, and other logical combinations of the RA signals may be applied without departing from the scope of the disclosure. Applicant also notes that the logic circuit 404 may be alternatively or additionally coupled to the decoder 412 to set the ColSeg0<1> signal in response to detection of an unassigned row address.

Figure 5:
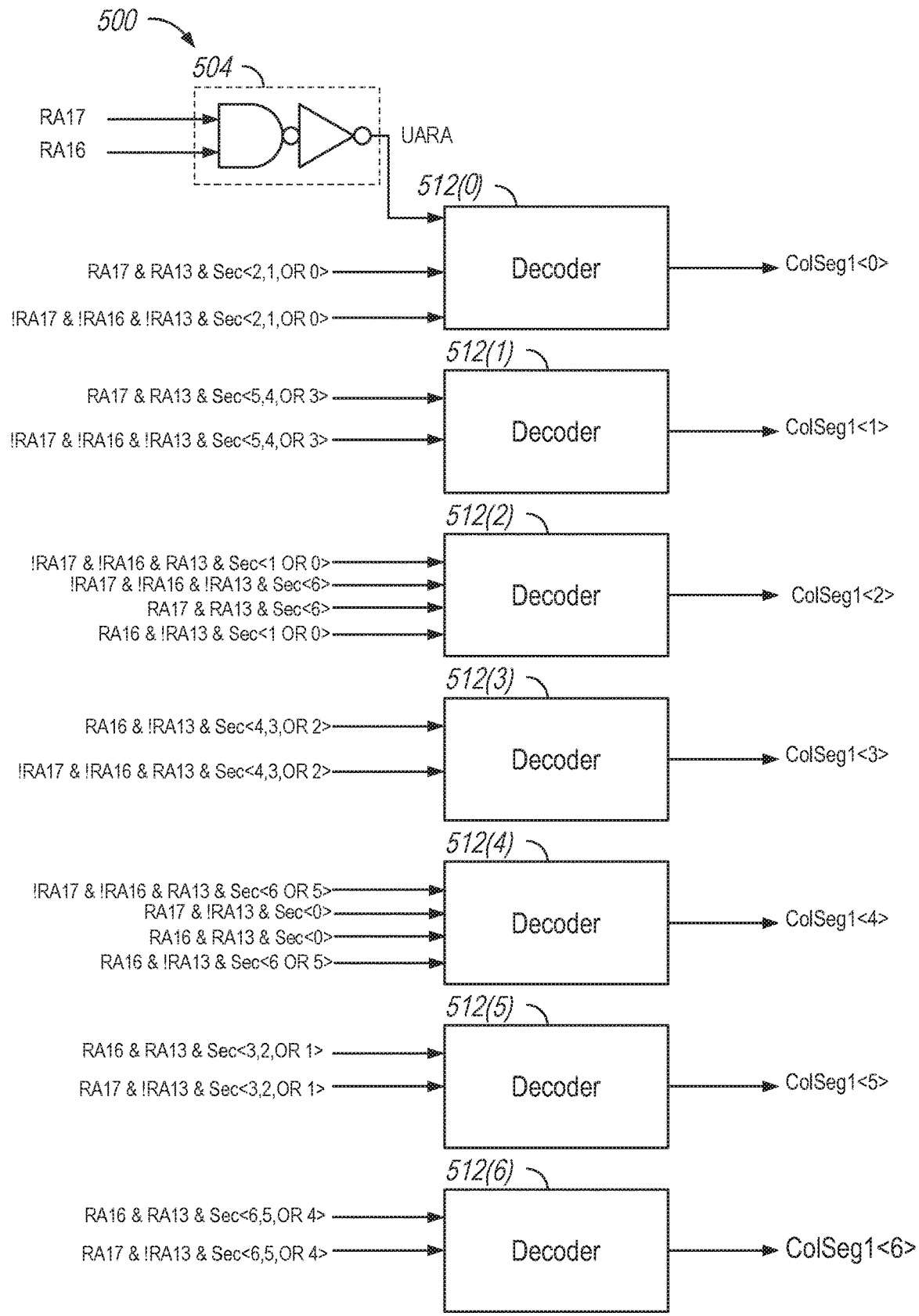
FIG. 5 depicts a block diagram of column segment 1 decoders 500 in accordance with embodiments of the present disclosure.

Similarly, in response to the UARA signal indicating an unassigned RA, the at least one decoder of the decoder circuits 344 for the ColSeg1<6:0> signals may force the corresponding one of the ColSeg1<6:0> signals to be set. For example, FIG. 5 depicts a block diagram of column segment 1 decoders 500 in accordance with embodiments of the present disclosure. As shown in FIG. 5, the decoders 512(0)-(6) may be configured to set the respective ColSeg1<6:0> signals in response to logical relationships between the RA17, RA16, RA13, and SEC<6:0> signals. Note that each respective individual logic statement depicted to the left of a corresponding one of the decoders 512(0)-(6) represents a combination of signal values that result in the corresponding one of the ColSeg1<6:0> signals being set, if the logic statement is TRUE. Each of the decoders 512(0)-(6) is configured to set the corresponding ColSeg1<6:0> signal when one of the respective set of logic statements is TRUE. In addition to the corresponding logic statements, the decoder 512(0) is configured to set the ColSeg1<0> signal in response to the UARA signal being (e.g., detection of an unassigned RA). The UARA signal may be set based on a bitwise AND comparison (e.g., via an AND gate 304) between the RA17 and RA16 signals. Applicant respectfully submits that the particular logic statements for each of the decoders 512(0)-(6) are exemplary, and other logical combinations of the RA and Sec<6:0> signals may be applied without departing from the scope of the disclosure. Applicant also notes that the logic circuit 504 may be alternatively or additionally coupled to one or more of the decoders 512(0)-(6) to set the respective ColSeg0<6:1> signals in response to detection of an unassigned row address.

Figure 6:
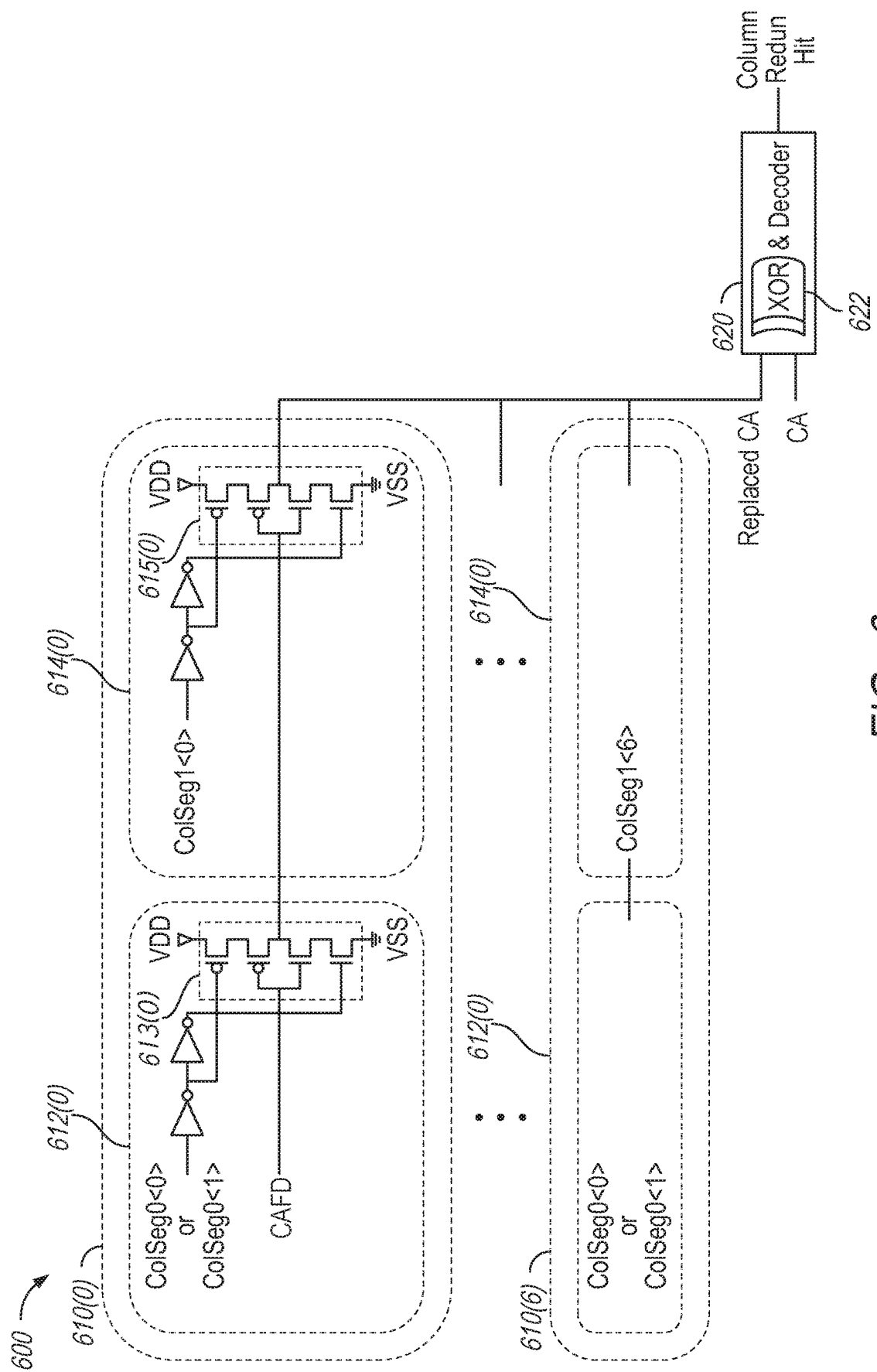
FIG. 6 depicts a schematic block diagram of a 600 in accordance with embodiments of the present disclosure.

Turning back to FIG. 3, the column redundancy detection circuit 342 may detect whether the CA has been replaced with a redundant CA based on the ColSeg0<1:0> and ColSeg1<6:0> signals and on the CAFD. For example, FIG. 6 depicts a schematic block diagram of a column redundancy detection circuit 600 in accordance with embodiments of the present disclosure. As shown in FIG. 6, the column redundancy detection circuit 600 includes respective fuse data decoders 610(0)-(6) configured to provide a replaced CA and a 620 having an 622 and a decoder that are configured to perform a bitwise exclusive OR comparison between the replaced CA and the CA to determine whether the CA has been replaced with a redundant CA. In response to detection that the CA matches the replaced CA, the 620 may set the column redundant hit signal. Each of the fuse data decoders 610 may include a respective ColSeg0 decoder circuit 612(0)-(6) coupled to a respective ColSeg1 decoder circuit 614(0)-(6). Each of the ColSeg0 decoder circuits 612(0)-(6) includes a respective inverter 613(0)-(6) that is enabled to invert a value of the CAFD when either of the ColSeg0<1:0> signals are set. The output of each respective inverters 613(0)-(6) is provided to the respective ColSeg1 decoder circuit 614(0)-(6). Each of the ColSeg1 decoder circuits 614(0)-(6) includes a respective inverter 615(0)-(6) that is enabled to invert a value of the output of the respective inverter 613(0)-(6) when the respective ColSeg1<6:0> signal is set. As shown in FIG. 6, if none of the ColSeg0<1:0> and ColSeg1<6:0> signals are set, every respective inverter 613(0)-(6) and every respective inverter 615(0)-(6) may be disabled. Thus, the column redundancy detection circuit 600 may be configured to provide the replaced CA signal with an undetermined value. That is, the output of the fuse data decoders 610(0)-(6) would be in a metastable state. Turning back to FIG. 3, employing the logic circuit 341 to cause a respective one of the ColSeg0<1:0> signals and a respective one of the ColSeg1<6:0> signals to be set may reduce a likelihood that the column redundancy detection circuit 342 would be in a metastable state.

Applicant notes that the specific RA bits and bit combinations used by the circuitry of FIGS. 3-6 are exemplary. Additional or different RA bits may be used to determine a column segment and detect whether a column has been replaced without departing from the scope of the disclosure. Employing the logic circuit 341 (e.g., and/or the logic circuit 404 of FIG. 4 and the logic circuit 504 of FIG. 5) to override logic of the decoders when an unassigned row address is detected may avoid circuitry of the semiconductor device 300 from entering a metastable state.

Figure 7:
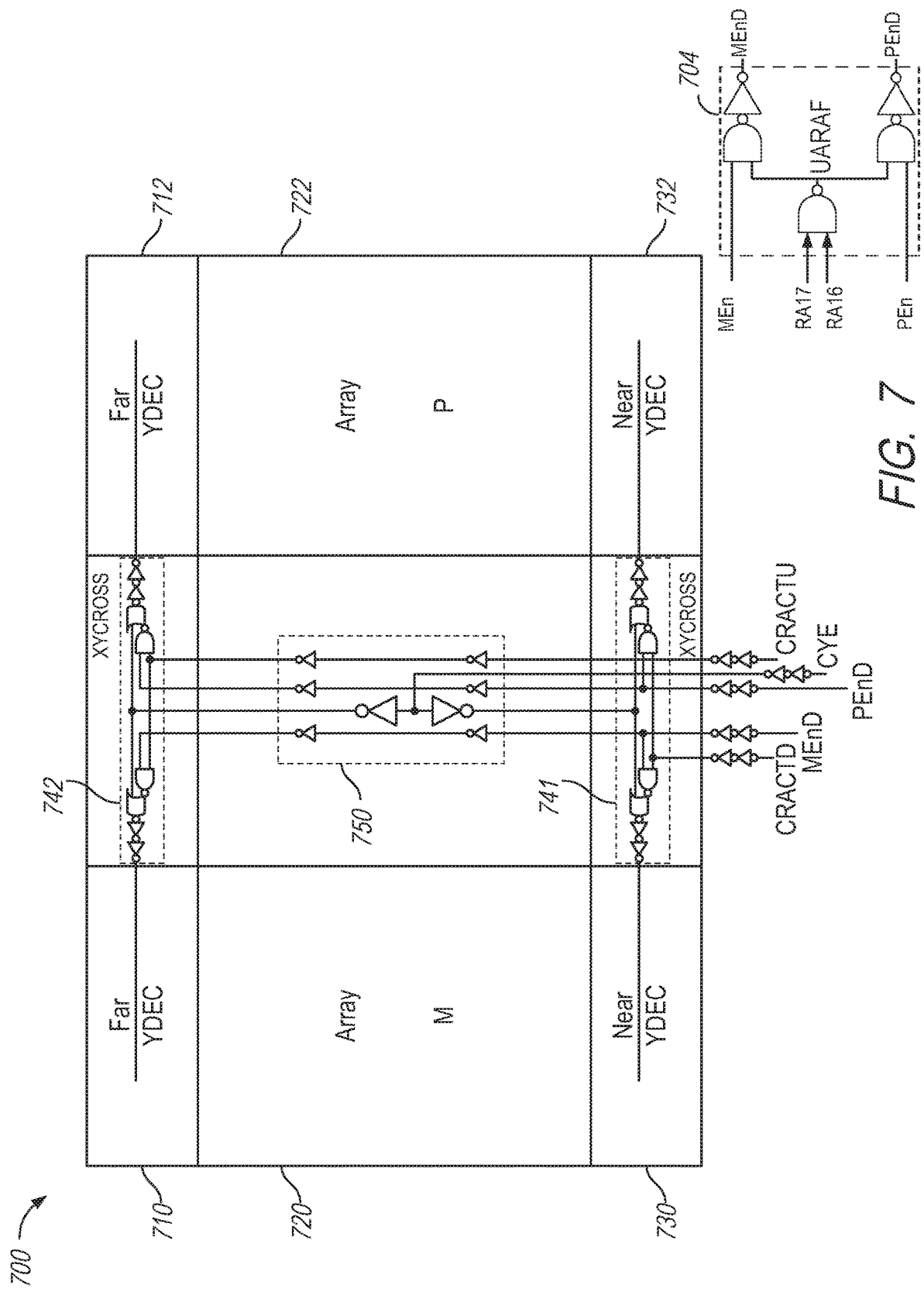
FIG. 7 depicts a block diagram of a portion of a memory cell array 700 and a logic circuit 704 of a semiconductor device in accordance with an embodiment of the disclosure.

FIG. 7 depicts a block diagram of a portion of a memory cell array 700 and a logic circuit 704 of a semiconductor device in accordance with an embodiment of the disclosure. The memory cell array 700 includes a M side memory array 720 sandwiched between M side far control signal lines 710 and M side near control signal lines 730, a P side memory array 722 sandwiched between P side far control signal lines 712 and P side near control signal lines 732. The memory cell array 700 further includes a 740 between the M side memory array 720 and the P side memory array 722 to provide control signals. The semiconductor device 100 of FIG. 1 may implement the memory cell array 700 and the logic circuit 704.

The logic circuit 704 may include a near column select control circuit 741 and a far column select control circuit 742 each configured to receive control signals, including array side enable signals MEnD and PEnD, upper and lower activation signals CRACTU and CRACTD, and a column enable signal CYE. The control signals may be received at a side of the memory cell array 700 near the near column select control circuit 741, and may be driven to the far column select control circuit 742 via a driver circuit 750. The CYE signal may be initially routed directly to the driver circuit 750 (e.g., at a location approximately halfway between the near column select control circuit 741 and the far column select control circuit 742), and then driven to the near column select control circuit 741 and the far column select control circuit 742 to align timing of activation of a column select signal by the near column select control circuit 741 and the far column select control circuit 742. The near column select control circuit 741 and the far column select control circuit 742 may activate the column select within the M side memory array 720 and/or the P side memory array 722 based on values of the control signals.

The logic circuit 704 may be configured to set the MEnD and PEnD signals based on MEn and PEn signals received from a command decoder (e.g., the command decoder 106 of FIG. 1) signals and the row address RA16 and RA17 signals. For example, when one or both of the RA16 and RA17 signals are cleared, the MEnD and PEnD signals may be controlled based on the values of the MEn and PEn signals, respectively, to enable or disable the near column select control circuit 741 and the far column select control circuit 742 for performance of a column select operation on either of the M side memory array 720 or the P side memory array 722. When both of the RA16 and RA17 signals are set, the MEnD and PEnD signals may be cleared (e.g., regardless of the values of the MEn and PEn signals, respectively, to disable performance of column select operations on the M side memory army 720 and the P side memory array 722.

Figure 8A:
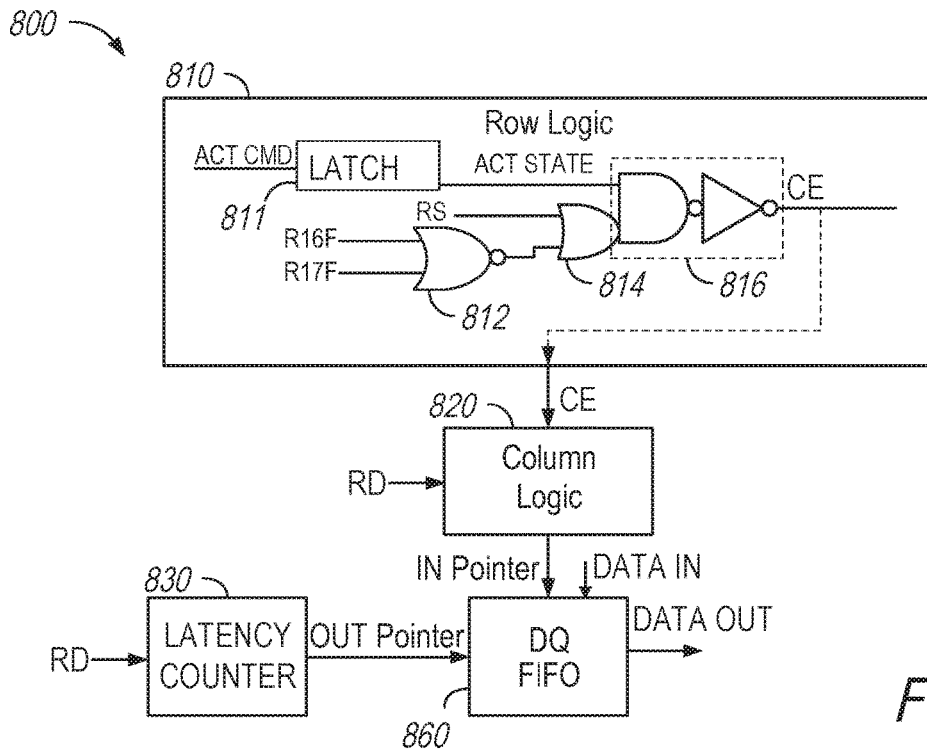
FIG. 8A depicts a block diagram of a portion of a semiconductor device 800 in accordance with an embodiment of the disclosure.
Figure 8B:
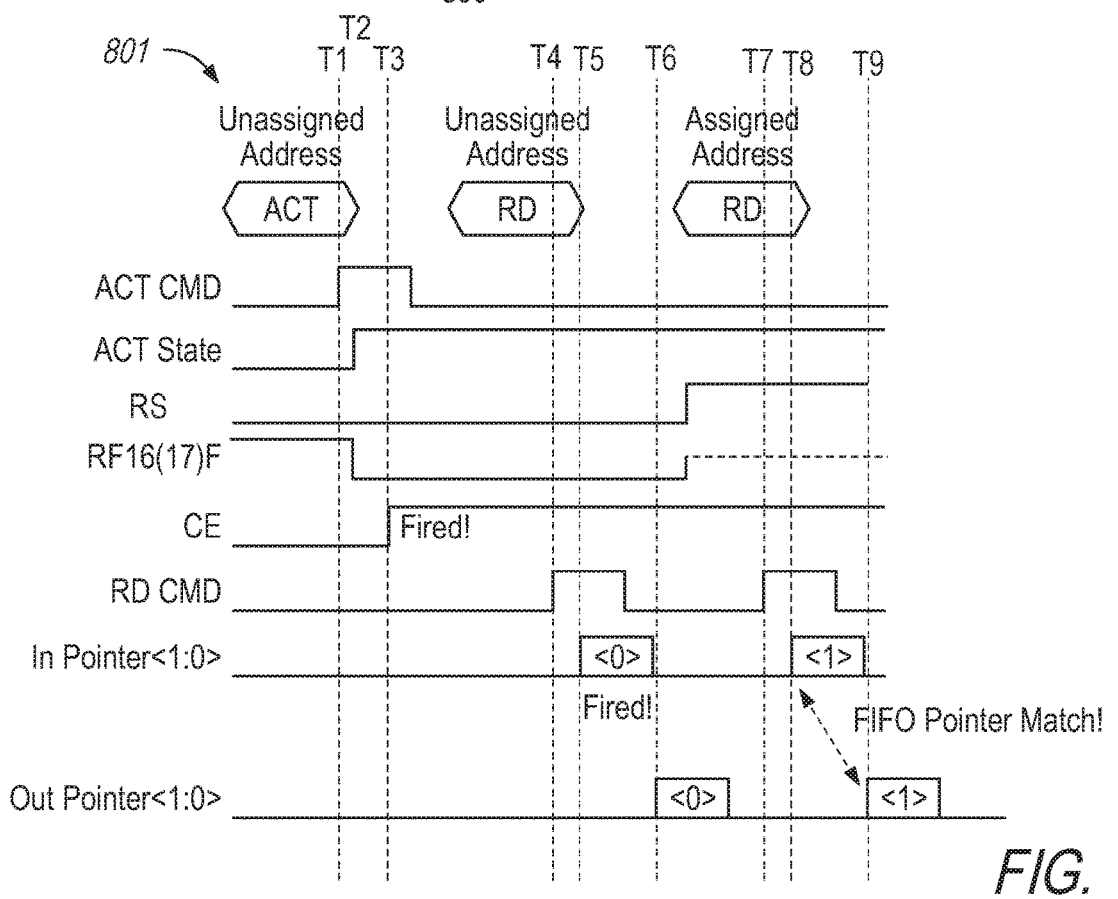
FIG. 8B depicts an exemplary timing diagram demonstrating control of input and output pointers associated with the DQ FIFO buffer of FIG. 8A in accordance with embodiments of the present disclosure.

FIG. 8A depicts a block diagram of a portion of a semiconductor device 800 in accordance with an embodiment of the disclosure. FIG. 8B depicts an exemplary timing diagram 801 demonstrating control of input and output pointers associated with the DQ FIFO buffer 860 of FIG. 8A in accordance with embodiments of the present disclosure. The semiconductor device 800 may include a row logic circuit 810, a column logic circuit 820, a latency counter 830, and a DQ FIFO buffer 860. The semiconductor device 100 of FIG. 1 may implement the semiconductor device 800.

The row logic circuit 810 may include a latch circuit 811, a NOR gate 812, an OR gate 814, and an AND gate 816. The latch circuit 811 may be configured to receive an ACT command and latch an ACT state signal in response to the ACT command. The NOR gate 812 may be configured to receive active low RA16 and RA17 signals RA16F and RA17F and to perform a bitwise NOR logic comparison to provide a first input to the OR gate 814. The output of the NOR gate 812 may indicate whether a row address associated with the RA16F and RA17F signals is an unassigned row address. The OR gate 814 may receive a row select signal RS at a second input, and may perform a bitwise OR logic comparison between the RS signal and the output of the NOR gate 812 to provide a first input to the AND gate 816. The RS signal may be set when a read address is an assigned address and may be cleared when the read address is an unassigned row address. The AND gate 816 may receive the ACT STATE signal at a second input and may perform a bitwise AND logic comparison between the ACT STATE signal and the output of the OR gate 814 to provide a column enable signal CE. Thus, the row logic circuit 810 may set the CE signal when the ACT STATE signal is set and either the RS signal is set or both of the RA16F and RA17F signals are set. Otherwise, the row logic circuit 810 may clear the CE signal.

The column logic circuit 820 may be configured to receive the CE signal and a read command RD. When the CE signal is set, the column logic circuit 820 may adjust (e.g., increment or decrement) an input pointer IN provided the DQ FIFO buffer 860 in response to the RD command. The latency counter 830 may receive the RD command and may adjust the output pointer OUT after a predetermined delay from receipt of the RD command.

As previously noted, the timing diagram 801 of FIG. 8B depicts operation of the semiconductor device 800 in response to receipt of an unassigned row address followed by an assigned row address. With reference to FIGS. 8A and 8B, prior to time T1, an external ACT command may be received, along with a corresponding row address. At time T1, the row logic circuit 810 may receive the ACT CMD signal may transition to a first (e.g., high or set) logical value in response to the external ACT command.

At time T2, the latch circuit 811 may latch the ACT STATE signal at the first logical value, in response to transition of the ACT CMD signal to the first logical value. Also at time T2, the RA16F and RA17F signals may both transition to a second (e.g., low or cleared) logical value indicating respective bit values of the corresponding row address received with the external ACT command. In response to the transition of the RA16F and the RA17F signals to the second logical value, the NOR gate 812 may transition the output to the first logical value. The RA16F and the RA17F both transitioning to the second logical value may correspond to an unassigned row address. Accordingly, the RS signal may remain at the second logical value. The OR gate 814 may set the output to the first logical value in response to the output of the NOR gate 812 having the first logical value.

At time T3, the AND gate 816 may transition the CE signal to the first logical value based on the ACT STATE signal having the first logical value and the output of the OR gate 814 having the first logical value. The CE signal may be provided to the column logic circuit 820.

Prior to time T4, an external RD command may be received, along with a corresponding column address. At time T4, the RD command signal may transition to the first logical value in response to the external RD command signal. The RD command signal may be provided to the column logic circuit 820 and to the latency counter 830. At time T5, the IN pointer may adjust to the [0] value in response to the RD command signal and based on the CE signal having the first logical value. After a delay from time T5 to T6 applied by the latency counter 830, the latency counter 830 may adjust the OUT pointer to the [0] value at time T6. Accordingly, both of the IN and OUT pointers may remain synchronized at the [0] value despite receiving the unassigned row address.

Prior to time T7, an assigned row address may be received. One or both of the RA16F and RA17F may be set to the first logical value in response to the assigned row address. In response to the assigned row address, the RS signal may be set. In response to the transition of the RA16F and the RA17F signals based on the assigned row address, the NOR gate 812 may transition the output to the second logical value. The OR gate 814 may set the output to the first logical value in response to the RS signal having the first logical value. After receipt of the assigned row address and prior to time T7, a second external RD command may be received, along with a corresponding column address. At time T7, the RD command signal may transition to the first logical value in response to the second external RD command signal. At time T8, the IN pointer may adjust to the [1] value in response to the RD command signal and based on the CE signal having the first logical value. After a delay from time T8 to T9 applied by the latency counter 830, the latency counter 830 may adjust the OUT pointer to the [1] value at time T6. Accordingly, both of the IN and OUT pointers may remain synchronized at the [1] value despite receiving the unassigned row address.

Thus, the row logic circuit 810 may prevent IN and OUT pointer mismatches in response to an unassigned row address. Applicant notes that the timing diagram 801 is exemplary, and that the relative timing between signals transitions is not intended to be to scale. Different relative timing relationships may be implemented without departing from the scope of the disclosure.

Applicant notes that, while foregoing describes that a determination as to whether a received row address is an unassigned row address is based on respective values of row address bits RA16 and RA17, it is appreciated that different or additional row address bits may be used to indicate an unassigned row address without departing from the scope of the disclosure.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
    an address decoder configured to receive a row address corresponding to a memory access operation, wherein the address decoder is configured to decode the row address to provide a decoded row address; and
    a section judgment circuit configured to receive the decoded row address and to determine a column segment address based on the decoded row address, wherein a determination of column redundancy corresponding to the memory access operation is based on the column segment address, wherein the section judgment circuit further comprises a logic circuit configured to cause the column segment address to be overridden in response to a determination that the decoded row address is an unassigned row address.

2. The apparatus of claim 1, wherein the logic circuit is configured to compare a first bit of the row address and a second bit of the row address to determine whether the decoded row address is an unassigned row address.

3. The apparatus of claim 1, wherein the logic circuit is configured to perform bitwise AND comparison between a first bit the row address and a second bit of the row address to determine whether the decoded row address is an unassigned row address.

4. The apparatus of claim 1, further comprising a column address redundancy control circuit configured to receive a decoded column address corresponding to the memory access operation and to determine whether the decoded column address is replaced with a redundant column address based on the column segment address to determine the column redundancy.

5. The apparatus of claim 1, further comprising a column logic circuit configured to disable column select activation in response to a determination that the decoded row address is an unassigned row address.

6. The apparatus of claim 5, wherein the column logic circuit configured to disable an array side enable signal configured to control whether a particular side of a memory array is enabled in response to a determination that the decoded row address is an unassigned row address to disable the column select activation.

7. The apparatus of claim 5, wherein the column logic circuit configured to determine whether the decoded row address is an unassigned row address based on a comparison between a first bit of the row address and a second bit of the row address.

8. The apparatus of claim 1, further comprising a row logic circuit configured to cause an input pointer configured to control a data buffer to adjust in response to a determination that the decoded row address is an unassigned row address.

9. The apparatus of claim 8, wherein the row logic circuit configured to determine whether the decoded row address is an unassigned row address based on a comparison between a first bit of the row address and a second bit of the row address.

10. The apparatus of claim 8, wherein the input pointer is adjusted in response to a read command and based on a column enable signal provided by the row logic circuit, wherein the row logic circuit is configured to set the column enable signal in response to the determination that the decoded row address is an unassigned row address.

* * * * *